(12) United States Patent
Huffaker (10) Patent No.: US 10,653,032 B2
(45) Date of Patent: May 12, 2020

(54) TABLET COMPUTER POSITIONING ASSEMBLY

(71) Applicant: James Huffaker, San Diego, CA (US)

(72) Inventor: James Huffaker, San Diego, CA (US)

(*) Notice: Subject to any disclaimer, the term of this patent is extended or adjusted under 35 U.S.C. 154(b) by 0 days.

(21) Appl. No.: 16/394,076

(22) Filed: Apr. 25, 2019

(65) Prior Publication Data

US 2019/0373756 A1    Dec. 5, 2019

Related U.S. Application Data

(60) Provisional application No. 62/674,295, filed on May 21, 2018.

(51) Int. Cl.
| | |
|---|---|
| *H02B 1/01* | (2006.01) |
| *H05K 7/18* | (2006.01) |
| *F16M 11/04* | (2006.01) |
| *H05K 5/02* | (2006.01) |

(52) U.S. Cl.
CPC ............... *H05K 7/18* (2013.01); *F16M 11/04* (2013.01); *H05K 5/0204* (2013.01); *F16M 2200/08* (2013.01)

(58) Field of Classification Search
USPC ......................................................... 361/829
See application file for complete search history.

(56) References Cited

U.S. PATENT DOCUMENTS

| | | | | |
|---|---|---|---|---|
| 4,354,601 A | * | 10/1982 | Harrison | ............... B43M 99/008 108/25 |
| 4,892,334 A | * | 1/1990 | Sinclair | ................... B43L 3/001 108/42 |
| 5,505,470 A | | 4/1996 | Hoshizaki | |
| 5,899,421 A | | 5/1999 | Silverman | |
| 5,915,661 A | | 6/1999 | Silverman | |
| 6,894,709 B2 | | 5/2005 | Pferrer | |
| 6,979,778 B2 | * | 12/2005 | Xiong | ..................... A47B 91/04 174/158 R |
| 7,506,592 B2 | | 3/2009 | Rossini | |
| 9,084,350 B2 | * | 7/2015 | Ho | ........................ H05K 5/0234 |
| 9,103,128 B2 | * | 8/2015 | Pomberger | .............. E04F 13/08 |
| 9,145,158 B2 | | 9/2015 | Cruz | |
| 9,441,782 B2 | | 9/2016 | Funk | |
| 9,491,344 B2 | * | 11/2016 | Takabatake | .......... H04N 5/2256 |
| 9,820,567 B1 | | 11/2017 | Zaloom | |
| 9,999,296 B1 | * | 6/2018 | Fan | ...................... A47B 23/043 |
| 2005/0040298 A1 | * | 2/2005 | Ohki | ...................... F16M 11/10 248/176.1 |

(Continued)

*Primary Examiner* — Hung S. Bui (57) ABSTRACT

A tablet computer positioning assembly for stabilizing and positioning a tablet computer includes a plate that is configured to position on a substantially horizontal surface. A first frame is coupled to and extends perpendicularly from the plate proximate to a first side of the plate. A second frame is pivotally coupled to the first frame and extends substantially perpendicularly from the first frame over the plate. The second frame is selectively fixedly couplable to the first frame so that the second frame is selectively angularly positionable relative to the plate. A plurality of couplers that is coupled to the second frame is configured to couple to a rim of a tablet computer to couple the tablet computer to the second frame so that the second frame is configured to selectively position the tablet computer relative to the plate.

19 Claims, 6 Drawing Sheets

(56) References Cited

U.S. PATENT DOCUMENTS

2010/0038514 A1\* 2/2010 Yu .................. A47B 23/044
                                                            248/449
2016/0270526 A1\* 9/2016 Siemer ............... F16M 11/38
2017/0251807 A1\* 9/2017 Haskins .............. A47B 23/002

\* cited by examiner

TABLET COMPUTER POSITIONING ASSEMBLY

CROSS-REFERENCE TO RELATED APPLICATIONS

I hereby claim the benefit under 35 U.S.C. Section 119(e) of U.S. Provisional application 62/674,295 filed on May 21, 2018.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

(2) Description of Related Art Including Information Disclosed Under 37 CFR 1.97 and 1.98

The disclosure and prior art relates to positioning assemblies and more particularly pertains to a new positioning assembly for stabilizing and positioning a tablet computer.

BRIEF SUMMARY OF THE INVENTION

An embodiment of the disclosure meets the needs presented above by generally comprising a plate that is configured to position on a substantially horizontal surface. A first frame is coupled to and extends perpendicularly from the plate proximate to a first side of the plate. A second frame is pivotally coupled to the first frame and extends substantially perpendicularly from the first frame over the plate. The second frame is selectively fixedly couplable to the first frame so that the second frame is selectively angularly positionable relative to the plate. A plurality of couplers that is coupled to the second frame is configured to couple to a rim of a tablet computer to couple the tablet computer to the second frame so that the second frame is configured to selectively position the tablet computer relative to the plate.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

With reference now to the drawings, and in particular to FIGS. 1 through 6 thereof, a new positioning assembly embodying the principles and concepts of an embodiment of the disclosure and generally designated by the reference numeral 10 will be described.

Figure 1:
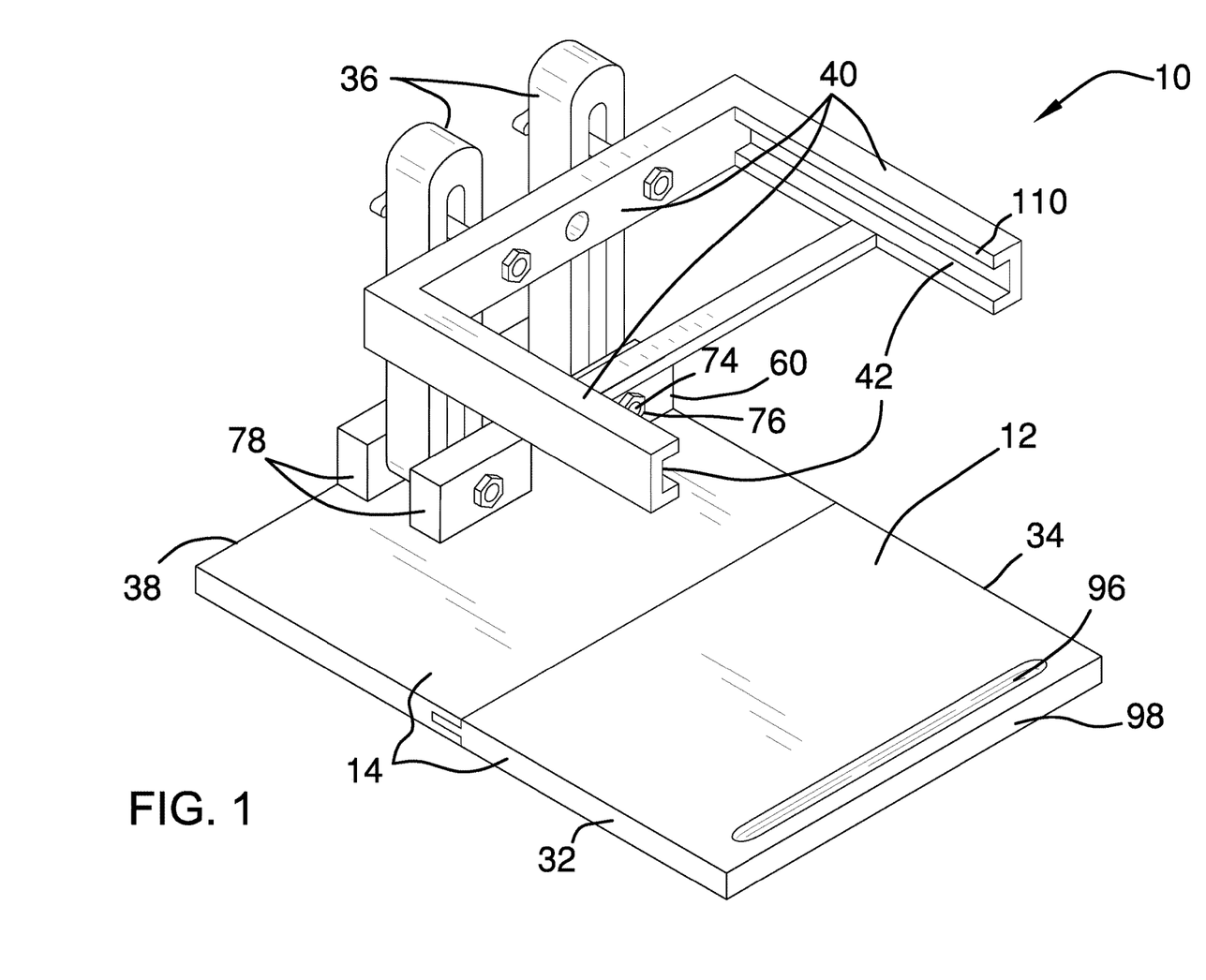
FIG. 1 is an isometric perspective view of a tablet computer positioning assembly according to an embodiment of the disclosure.
Figure 2:
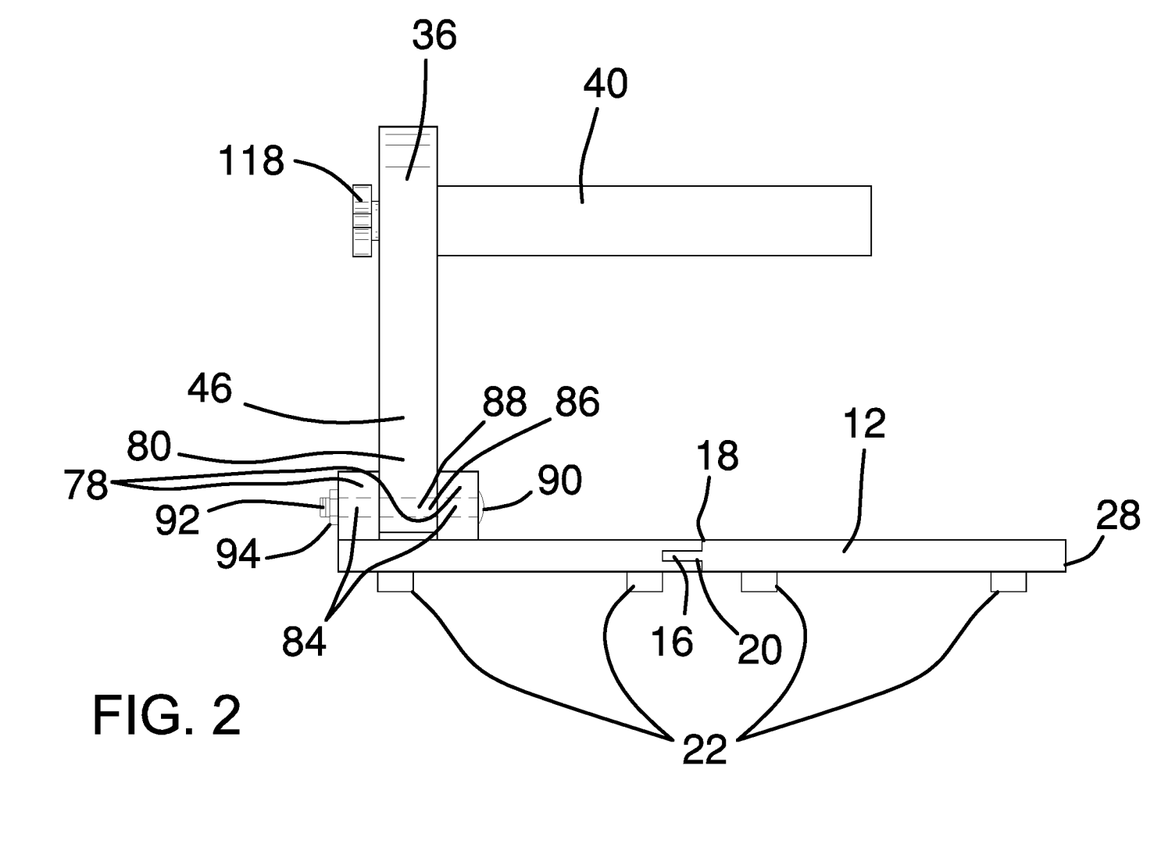
FIG. 2 is a front view of an embodiment of the disclosure.

As best illustrated in FIGS. 1 through 6, the tablet computer positioning assembly 10 generally comprises a plate 12 that is configured to position on a substantially horizontal surface. The plate 12 is rectangularly shaped and comprises a pair of sections 14, as shown in FIG. 2. A tongue 16 is coupled to and extends from an inner edge 18 of one of the sections 14. A groove 20 that extends into the inner edge 18 of the other of the sections 14 is positioned to insert the tongue 16 to mutually couple the pair of sections 14.

Figure 6:
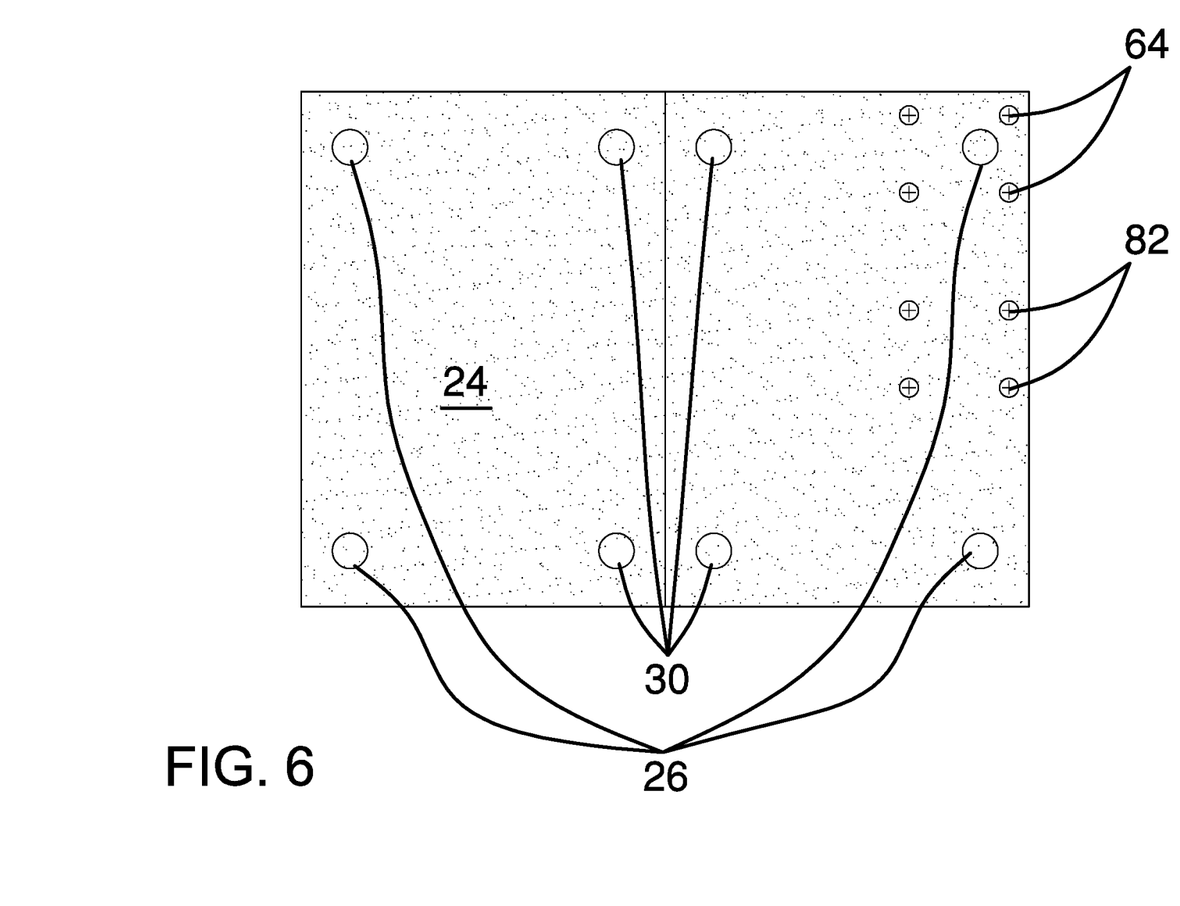
FIG. 6 is a bottom view of an embodiment of the disclosure.

A plurality of footings 22 is coupled to a lower face 24 of the plate 12, as shown in FIG. 6. The footings 22 are configured to stabilize the plate 12 on the substantially horizontal surface. The footings 22 comprises at least one of rubber and silicone so that the footings 22 are configured to frictionally couple to the horizontal surface. The plurality of footings 22 comprises a set of four first feet 26 that is positioned singly proximate to corners 28 of the plate 12. The plurality of footings 22 also comprises a set of four second feet 30 that is positioned two apiece on the first section 14 and the second section 14 proximate to the tongue 16 and the groove 20, respectively, and proximate to a front edge 32 and a back edge 34 of the plate 12.

A first frame 36 is coupled to and extends perpendicularly from the plate 12 proximate to a first side 38 of the plate 12. A second frame 40 is pivotally coupled to the first frame 36 and extends substantially perpendicularly from the first frame 36 over the plate 12. The second frame 40 is selectively fixedly couplable to the first frame 36 so that the second frame 40 is selectively angularly positionable relative to the plate 12. A plurality of couplers 42 that is coupled to the second frame 40 is configured to couple to a rim of a tablet computer to couple the tablet computer to the second frame 40. The second frame 40 is configured to selectively position the tablet computer relative to the plate 12. The plate 12 also is configured to position a keyboard that is operationally coupled to the tablet computer.

Many individuals frequently use electronic devices, such as laptops, tablet computers, and mobile phones. In particular, many individuals use tablet computers for professional and recreational purposes, including to read articles, write emails, navigate the internet, and the like. Unfortunately, many individuals must strain their eyes to properly view the tablet screen. Some individuals are visually impaired, which exacerbates the difficulty of properly viewing a screen of a tablet computer. Furthermore, some individuals may prefer to view the screen of the tablet computer at a desired distance and angle that cannot be achieved using a static stand. The assembly 10 enables a user to easily view a screen of the tablet computer at a desired angle and distance. Minor modifications to the disclosed assembly 10, which are obvious to those skilled in the art of stands for electronic devices, would enable the use of the assembly 10 with cellular phones, laptop computer, and the like.

Figure 3:
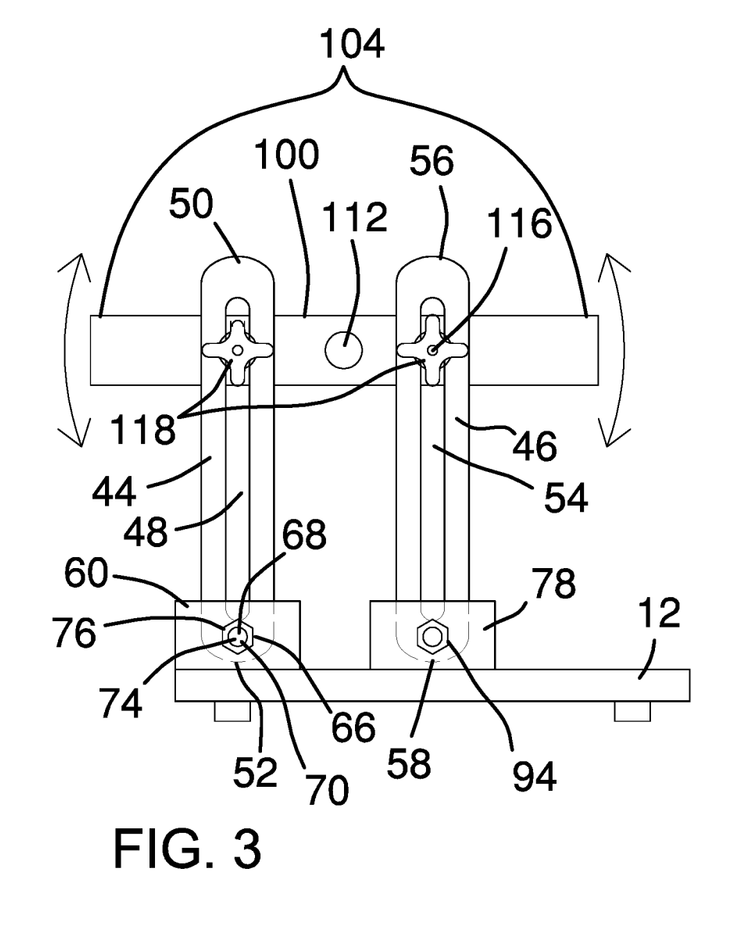
FIG. 3 is a first side view of an embodiment of the disclosure.

The first frame 36 comprises a first bar 44 and a second bar 46, as shown in FIG. 3. The first bar 44 is pivotally coupled to and extends from the plate 12 proximate to a respective corner 28 of the plate 12. A first slot 48 is positioned in the first bar 44 and extends from proximate to a top end 50 to proximate to a bottom end 52 of the first bar 44. The top end 50 and the bottom end 52 of the first bar 44 are arcuate.

The second bar 46 is pivotally coupled to and extends from the plate 12 proximate to the first side 38 of the plate 12 and substantially equally distant from the front edge 32 and the back edge 34 of the plate 12. A second slot 54 is positioned in the second bar 46 and extends from proximate to an upper terminus 56 to proximate to a lower terminus 58 of the second bar 46. The upper terminus 56 and the lower terminus 58 of the second bar 46 are arcuate.

Figure 5:
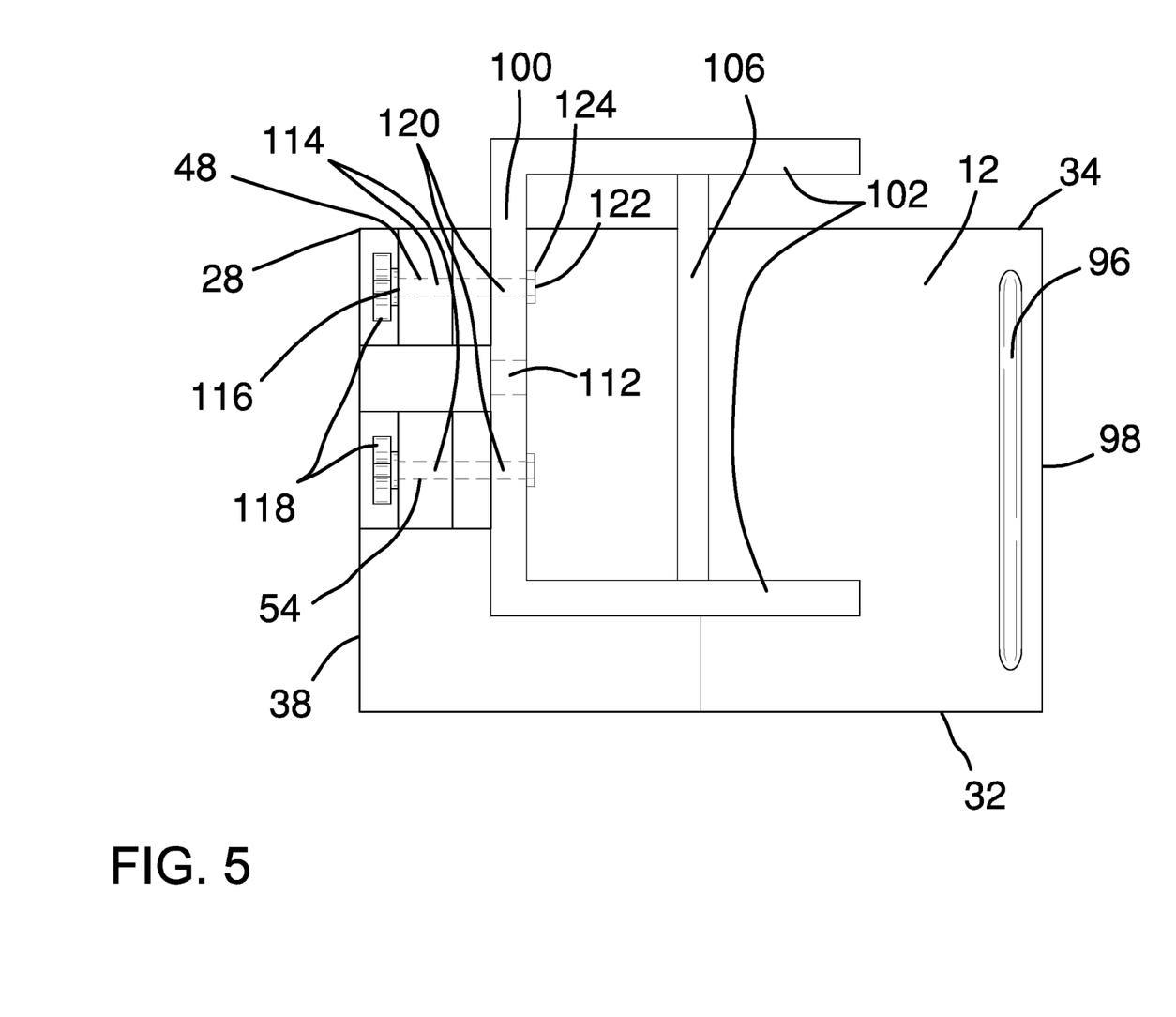
FIG. 5 is a top view of an embodiment of the disclosure.

A pair of first blocks 60 is coupled to and extends perpendicularly from the plate 12 to define a first gap 62, as shown in FIG. 5. The first bar 44 is positioned in the first gap 62 and is pivotally coupled to the pair of first blocks 60 so that the first bar 44 is positioned to be selectively pivoted relative to the plate 12. Each first block 60 is coupled to the plate 12 by a respective pair of first screws 64.

A pair of first holes 66 is positioned singly in the first blocks 60. A first aperture 68 is positioned in the first bar 44 between the first slot 48 and the bottom end 52 of the first bar 44 so that the first aperture 68 is aligned with the pair of first holes 66. A first bolt 70 is positioned through the pair of first holes 66 and the first aperture 68 so that a head 72 of the first bolt 70 is positioned in abutment to one of the first blocks 60 and so that a threaded end 74 of the first bolt 70 protrudes from the other of the first blocks 60. A first nut 76 is threadedly coupled to the threaded end 74 of the first bolt 70, as shown in FIG. 3. The first nut 76 is configured to be tightened to secure the first bar 44 at a selected angle relative to the plate 12.

A pair of second blocks 78 is coupled to and extends perpendicularly from the plate 12 to define a second gap 80, as shown in FIG. 5. The second bar 46 is positioned in the second gap 80 and is pivotally coupled to the pair of second blocks 78 so that the second bar 46 is positioned to be selectively pivoted relative to the plate 12. Each second block 78 is coupled to the plate 12 by a respective pair of second screws 82.

A pair of second holes 84 is positioned singly in the second blocks 78. A second aperture 86 is positioned in the second bar 46 between the second slot 54 and the lower terminus 58 of the second bar 46 so that the second aperture 86 is aligned with the pair of second holes 84. A second bolt 88 is positioned through the pair of second holes 84 and the second aperture 86 so that a head 90 of the second bolt 88 is positioned in abutment to one of the second blocks 78 and so that a threaded endpoint 92 of the second bolt 88 protrudes from the other of the second blocks 78. A second nut 94 is threadedly coupled to the threaded endpoint 92 of the second bolt 88, as shown in FIG. 3. The second nut 94 is configured to be tightened to secure the second bar 46 at a selected angle relative to the plate 12.

A recess 96 that is positioned in the plate 12 proximate to a second side 98 of the plate 12 extends from proximate to the front edge 32 to proximate to the back edge 34 of the plate 12, as shown in FIG. 5. The recess 96 is configured to selectively position a pen and a stylus so that the pen or stylus is readily available to the user.

The second frame 40 comprises a first beam 100 and a pair of second beams 102, as shown in FIG. 5. The first beam 100 is pivotally coupled to and extends between the first bar 44 and the second bar 46. Each second beam 102 is coupled singly to a respective opposing end 104 of the first beam 100 and extends perpendicularly from the first beam 100. A crossbeam 106 that is coupled to and extends between the pair of second beams 102 is positioned to stabilize the pair of second beams 102 relative to the first beam 100.

The plurality of couplers 42 comprises a pair of channels 108. Each channel 108 is positioned in an inner face 110 of a respective second beam 102, as shown in FIG. 1. The pair of channels 108 is configured to insert the tablet computer to couple the tablet computer to the second frame 40.

A cord hole 112 that is positioned through the first beam 100 substantially equally distant from the opposing ends 104, as shown in FIG. 3, is configured to insert a power cord of the tablet computer.

A pair of rods 114 is coupled to and extends from the first beam 100, as shown in FIG. 5. The rods 114 are opposingly positioned on the first beam 100 relative to the pair of second beams 102 so that the rods 114 extend singly through the first slot 48 and the second slot 54. Each rod 114 has a first end 116 distal from the first beam 100, which is threaded.

Each of a pair of knobs 118 is threadedly coupled to a respective rod 114, as shown in FIG. 3. The knobs 118 are configured to be grasped in digits of a hand of the user, positioning the user to loosen the knobs 118 so that the rods 114 are selectively positionable within the first slot 48 and the second slot 54 to position the second frame 40 in the position selected by the user. The knobs 118 are configured to be tightened to fixedly position the second frame 40 and the tablet relative to the plate 12.

Figure 4:
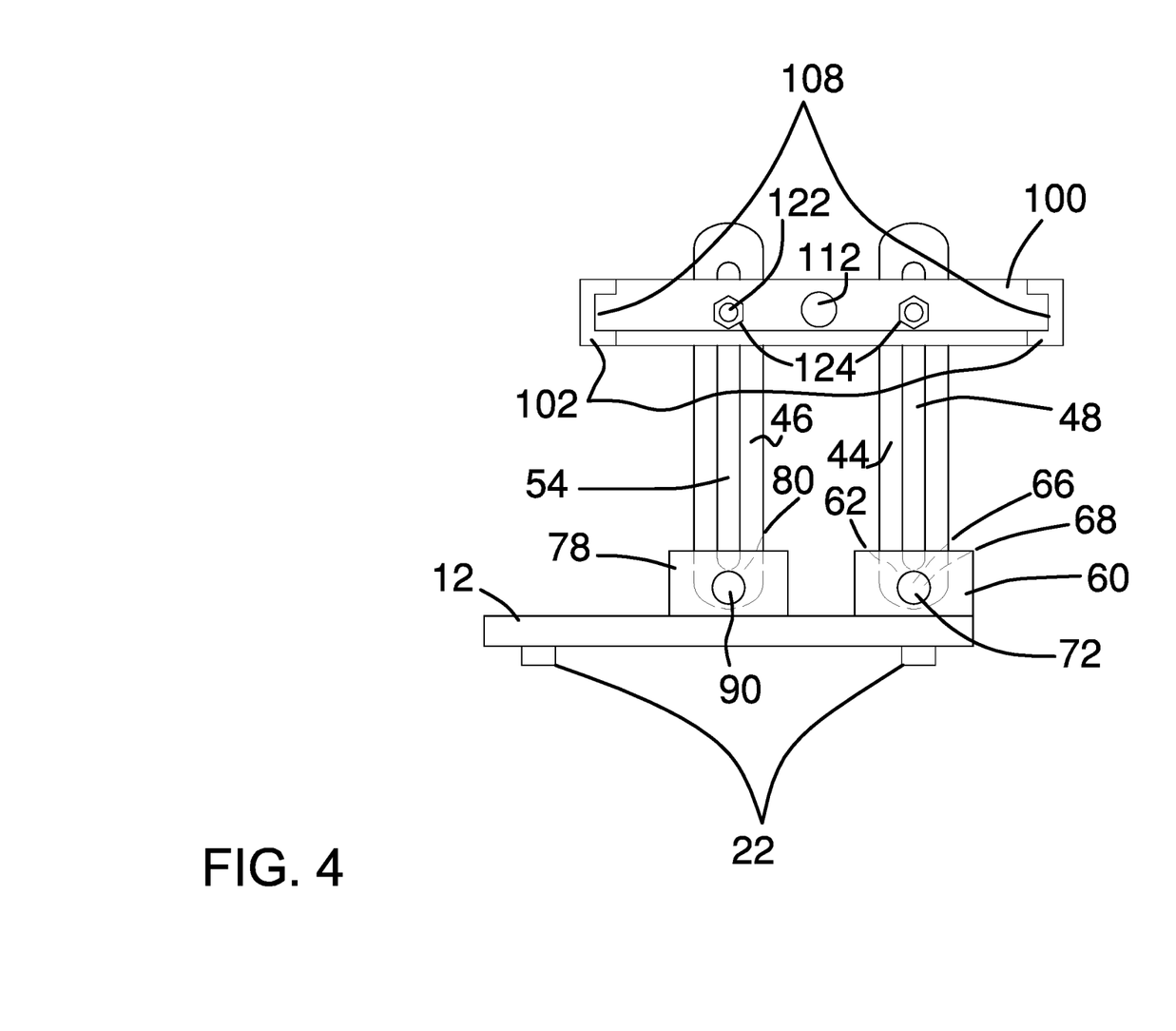
FIG. 4 is a second side view of an embodiment of the disclosure.

Each rod 114 is positioned through an associated opening 120 of a pair of openings 120 that is positioned in the first beam 100 so that a second end 122 of the rod 114 protrudes from the first beam 100. The second end 122 is threaded. Each of a pair of rod nuts 124 is threadedly coupled to the second end 122 of a respective rod 114 so that the respective rod 114 is coupled to the first beam 100, as shown in FIG. 4.

In use, the angle of the second frame 40 relative to the plate 12 is optimized for use by the user by a combination of adjustments to the angles of the first bar 44 and second bar 46 relative to the plate 12 and to the positions of the pair of rods 114 in the first slot 48 and the second slot 54. The tablet computer is coupled to the second frame 40 by sliding it into the pair of channels 108 that is positioned in the second frame 40.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A tablet computer positioning assembly comprising:
   a plate configured for positioning on a substantially horizontal surface;
   a first frame coupled to and extending perpendicularly from the plate proximate to a first side of the plate;
   a second frame pivotally coupled to the first frame and extending substantially perpendicularly from the first frame over the plate, the second frame being selectively fixedly couplable to the first frame such that the second frame is selectively angularly positionable relative to the plate;
   a plurality of couplers coupled to the second frame, the couplers being configured for coupling to a rim of a tablet computer for coupling the tablet computer to the second frame wherein the second frame is configured for selectively positioning the tablet computer relative to the plate;
   the first frame comprising:
      a first bar pivotally coupled to and extending from the plate,
      a first slot positioned in the first bar, the first slot extending from proximate to a top end to proximate to a bottom end of the first bar,
      a second bar pivotally coupled to and extending from the plate proximate to the first side of the plate, and
      a second slot positioned in the second bar, the second slot extending from proximate to an upper terminus to proximate to a lower terminus of the second bar; and
   the second frame comprising:
      a first beam pivotally coupled to and extending between the first bar and the second bar, and
      a pair of second beams coupled singly to opposing ends of the first beam and extending perpendicularly from the first beam.

2. The assembly of claim 1, further comprising:
   the plate being rectangularly shaped, the plate comprising a pair of sections;
   a tongue coupled to and extending from an inner edge of one of the sections; and
   a groove extending into the inner edge of the other of the sections wherein the groove is positioned for inserting the tongue for mutually coupling the pair of sections.

3. The assembly of claim 2, further including a plurality of footings coupled to a lower face of the plate wherein the footings are configured for stabilizing the plate on the substantially horizontal surface, the plurality of footings comprising a set of four first feet positioned singly proximate to corners of the plate.

4. The assembly of claim 3, further including the plurality of footings comprising a set of four second feet positioned two apiece on the first section and the second section proximate to the tongue and the groove, respectively, and proximate to a front edge and a back edge of the plate.

5. The assembly of claim 1, further including a plurality of footings coupled to a lower face of the plate wherein the footings are configured for stabilizing the plate on the substantially horizontal surface.

6. The assembly of claim 5, further including the footings comprising at least one of rubber and silicone wherein the footings are configured for frictionally coupling to the horizontal surface.

7. The assembly of claim 5, further including the plurality of footings comprising a set of four first feet positioned singly proximate to corners of the plate.

8. The assembly of claim 1, further comprising:
   the first bar being positioned proximate to a respective corner of the plate; and
   the second bar being positioned substantially equally distant from a front edge and a back edge of the plate.

9. The assembly of claim 1, further comprising:
   the top end and the bottom end of the first bar being arcuate; and
   the upper terminus and the lower terminus of the second bar being arcuate.

10. The assembly of claim 1, further comprising:
    a pair of first blocks coupled to and extending perpendicularly from the plate defining a first gap, the first bar being positioned in the first gap and pivotally coupled to the pair of first blocks wherein the first bar is positioned for selectively pivoting relative to the plate; and
    a pair of second blocks coupled to and extending perpendicularly from the plate defining a second gap, the second bar being positioned in the second gap and pivotally coupled to the pair of second blocks wherein the second bar is positioned for selectively pivoting relative to the plate.

11. The assembly of claim 10, further comprising:
    each first block being coupled to the plate by a respective pair of first screws; and
    each second block being coupled to the plate by a respective pair of second screws.

12. The assembly of claim 10, further comprising:
    a pair of first holes positioned singly in the first blocks;
    a first aperture positioned in the first bar between the first slot and the bottom end of the first bar such that the first aperture is aligned with the pair of first holes;
    a first bolt positioned through the pair of first holes and the first aperture such that a head of the first bolt is positioned in abutment to one of the first blocks and such that a threaded end of the first bolt protrudes from the other of the first blocks;
    a first nut threadedly coupled to the threaded end of the first bolt wherein the first nut is configured for tightening for securing the first bar at a selected angle relative to the plate;
    a pair of second holes positioned singly in the second blocks;

a second aperture positioned in the second bar between the second slot and the lower terminus of the second bar such that the second aperture is aligned with the pair of second holes;

a second bolt positioned through the pair of second holes and the second aperture such that a head of the second bolt is positioned in abutment to one of the second blocks and such that a threaded endpoint of the second bolt protrudes from the other of the second blocks; and a second nut threadedly coupled to the threaded endpoint of the second bolt wherein the second nut is configured for tightening for securing the second bar at a selected angle relative to the plate.

13. The assembly of claim 1, further including a recess positioned in the plate proximate to a second side of the plate, the recess extending from proximate to a front edge to proximate to a back edge of the plate wherein the recess is configured for selectively positioning a pen and a stylus.

14. The assembly of claim 1, further including a crossbeam coupled to and extending between the pair of second beams wherein the crossbeam is positioned for stabilizing the pair of second beams relative to the first beam.

15. The assembly of claim 1, further including the plurality of couplers comprising a pair of channels, each channel being positioned in an inner face of a respective second beam wherein the pair of channels is configured for inserting the tablet computer for coupling the tablet computer to the second frame.

16. The assembly of claim 1, further including a cord hole positioned through the first beam substantially equally distant from the opposing ends wherein the cord hole is configured for inserting a power cord of the tablet computer.

17. The assembly of claim 1, further comprising:
a pair of rods coupled to and extending from the first beam, the rods being opposingly positioned on the first beam relative to the pair of second beams such that the rods extend singly through the first slot and the second slot, each rod having a first end distal from the first beam, the first end being threaded; and
a pair of knobs, each knob being threadedly coupled to a respective rod wherein the knobs are configured for grasping in digits of a hand of a user positioning the user for loosening the knobs such that the rods are selectively positionable within the first slot and the second slot for positioning the second frame in the position selected by a user wherein the knobs are configured for tightening for fixedly positioning the second frame and the tablet relative to the plate.

18. The assembly of claim 17, further comprising:
a pair of openings positioned in the first beam, each rod being positioned through an associated opening such that a second end of the rod protrudes from the first beam, the second end being threaded; and
a pair of rod nuts, each rod nut being threadedly coupled to the second end of a respective rod such that the respective rod is coupled to the first beam.

19. A tablet computer positioning assembly comprising:
a plate configured for positioning on a substantially horizontal surface, the plate being rectangularly shaped, the plate comprising a pair of sections;
a tongue coupled to and extending from an inner edge of one of the sections;
a groove extending into the inner edge of the other of the sections wherein the groove is positioned for inserting the tongue for mutually coupling the pair of sections;
a plurality of footings coupled to a lower face of the plate wherein the footings are configured for stabilizing the plate on the substantially horizontal surface, the footings comprising at least one of rubber and silicone wherein the footings are configured for frictionally coupling to the horizontal surface, the plurality of footings comprising a set of four first feet positioned singly proximate to corners of the plate, the plurality of footings comprising a set of four second feet positioned two apiece on the first section and the second section proximate to the tongue and the groove, respectively, and proximate to a front edge and a back edge of the plate;
a first frame coupled to and extending perpendicularly from the plate proximate to a first side of the plate, the first frame comprising:
a first bar pivotally coupled to and extending from the plate, the first bar being positioned proximate to a respective corner of the plate,
a first slot positioned in the first bar, the first slot extending from proximate to a top end to proximate to a bottom end of the first bar, the top end and the bottom end of the first bar being arcuate,
a second bar pivotally coupled to and extending from the plate proximate to the first side of the plate, the second bar being positioned substantially equally distant from the front edge and the back edge of the plate,
a second slot positioned in the second bar, the second slot extending from proximate to an upper terminus to proximate to a lower terminus of the second bar, the upper terminus and the lower terminus of the second bar being arcuate,
a pair of first blocks coupled to and extending perpendicularly from the plate defining a first gap, the first bar being positioned in the first gap and pivotally coupled to the pair of first blocks wherein the first bar is positioned for selectively pivoting relative to the plate, each first block being coupled to the plate by a respective pair of first screws,
a pair of first holes positioned singly in the first blocks,
a first aperture positioned in the first bar between the first slot and the bottom end of the first bar such that the first aperture is aligned with the pair of first holes,
a first bolt positioned through the pair of first holes and the first aperture such that a head of the first bolt is positioned in abutment to one of the first blocks and such that a threaded end of the first bolt protrudes from the other of the first blocks,
a first nut threadedly coupled to the threaded end of the first bolt wherein the first nut is configured for tightening for securing the first bar at a selected angle relative to the plate,
a pair of second blocks coupled to and extending perpendicularly from the plate defining a second gap, the second bar being positioned in the second gap and pivotally coupled to the pair of second blocks wherein the second bar is positioned for selectively pivoting relative to the plate, each second block being coupled to the plate by a respective pair of second screws,
a pair of second holes positioned singly in the second blocks,
a second aperture positioned in the second bar between the second slot and the lower terminus of the second bar such that the second aperture is aligned with the pair of second holes,
a second bolt positioned through the pair of second holes and the second aperture such that a head of the second bolt is positioned in abutment to one of the second blocks and such that a threaded endpoint of the second bolt protrudes from the other of the second blocks,
a second nut threadedly coupled to the threaded endpoint of the second bolt wherein the second nut is configured for tightening for securing the second bar at a selected angle relative to the plate;
a recess positioned in the plate proximate to a second side of the plate, the recess extending from proximate to the front edge to proximate to the back edge of the plate wherein the recess is configured for selectively positioning a pen and a stylus;
a second frame pivotally coupled to the first frame and extending substantially perpendicularly from the first frame over the plate, the second frame being selectively fixedly couplable to the first frame such that the second frame is selectively angularly positionable relative to the plate, the second frame comprising:
  a first beam pivotally coupled to and extending between the first bar and the second bar,
  a pair of second beams coupled singly to opposing ends of the first beam and extending perpendicularly from the first beam, and
  a crossbeam coupled to and extending between the pair of second beams wherein the crossbeam is positioned for stabilizing the pair of second beams relative to the first beam;
a plurality of couplers coupled to the second frame, the couplers being configured for coupling to a rim of a tablet computer for coupling the tablet computer to the second frame wherein the second frame is configured for selectively positioning the tablet computer relative to the plate, the plurality of couplers comprising a pair of channels, each channel being positioned in an inner face of a respective second beam wherein the pair of channels is configured for inserting the tablet computer for coupling the tablet computer to the second frame;
a cord hole positioned through the first beam substantially equally distant from the opposing ends wherein the cord hole is configured for inserting a power cord of the tablet computer;
a pair of rods coupled to and extending from the first beam, the rods being oppositely positioned on the first beam relative to the pair of second beams such that the rods extend singly through the first slot and the second slot, each rod having a first end distal from the first beam, the first end being threaded;
a pair of knobs, each knob being threadedly coupled to a respective rod wherein the knobs are configured for grasping in digits of a hand of a user positioning the user for loosening the knobs such that the rods are selectively positionable within the first slot and the second slot for positioning the second frame in the position selected by the user wherein the knobs are configured for tightening for fixedly positioning the second frame and the tablet relative to the plate;
a pair of openings positioned in the first beam, each rod being positioned through an associated opening such that a second end of the rod protrudes from the first beam, the second end being threaded; and
a pair of rod nuts, each rod nut being threadedly coupled to the second end of a respective rod such that the respective rod is coupled to the first beam.

* * * * *